United States Patent [19]

Cerofolini et al.

[11] 4,277,291

[45] Jul. 7, 1981

[54] PROCESS FOR MAKING CMOS FIELD-EFFECT TRANSISTORS

[75] Inventors: Gianfranco Cerofolini; Giuseppe Ferla, both of Milan, Italy

[73] Assignee: SGS-ATES Componenti Elettronici S.p.A., Agrate Brianza, Italy

[21] Appl. No.: 113,594

[22] Filed: Jan. 21, 1980

[30] Foreign Application Priority Data

Jan. 22, 1979 [IT]  Italy .................................. 19484 A/79

[51] Int. Cl.³ ............................................. C22B 21/26
[52] U.S. Cl. ..................................... 148/1.5; 148/187; 148/188; 148/190; 29/571; 29/576 B
[58] Field of Search ................. 148/187, 1.5, 188, 190; 29/571, 576 B

[56] References Cited

U.S. PATENT DOCUMENTS

| | | | |
|---|---|---|---|
| 3,853,633 | 12/1974 | Armstrong | 148/1.5 |
| 3,986,896 | 10/1976 | Veno et al. | 148/1.5 |
| 4,013,484 | 3/1977 | Boleky et al. | 148/1.5 |
| 4,135,955 | 1/1979 | Gasner et al. | 148/187 |
| 4,149,915 | 4/1979 | Bohg et al. | 148/1.5 X |

OTHER PUBLICATIONS

Lilen, H., *Principes et Applications des CI/MOS*, Editions Radio, Paris, France, 1972, pp. 54-59.

*Primary Examiner*—G. Ozaki
*Attorney, Agent, or Firm*—Karl F. Ross

[57] ABSTRACT

Two patches of silicon nitride are formed above spaced-apart regions of an n-type substrate (2) on an overlying oxide layer (8) of small thickness. Arsenic ions are then implanted through the oxide layer in substrate areas not covered by the patches whereupon one patch (10a) and an adjoining portion of the oxide layer are covered by a photoresist mask (14), leaving unprotected the second patch (10b) and an oxide portion adjacent thereto. The wafer is then bombarded with boron ions, first at a relatively low energy level to penetrate the last-mentioned oxide portion and then at a higher energy level with additional penetration of the second patch (10b) to form a p-well (18) bounded by a p+ guard zone (20); the previously implanted arsenic ions in the unbombarded area form an n+ guard zone (22). Next, the wafer is subjected to a heat treatment in an oxidizing atmosphere with resulting deepening of the guard zones and the p-well and with growth of the oxide layer especially in areas not overlain by the patches whose subsequent removal, together with other oxide portions except for a residue forming two insulating gate supports (24a, 24b), exposes source and drain areas of the p-well (18) and of an n-type pedestal (19) separated therefrom by the guard zones (20, 22). A phosphorus-doped oxide layer (28) is then formed above the p-well whereupon the wafer is heated in a boron atmosphere.

4 Claims, 6 Drawing Figures

FIG. 4
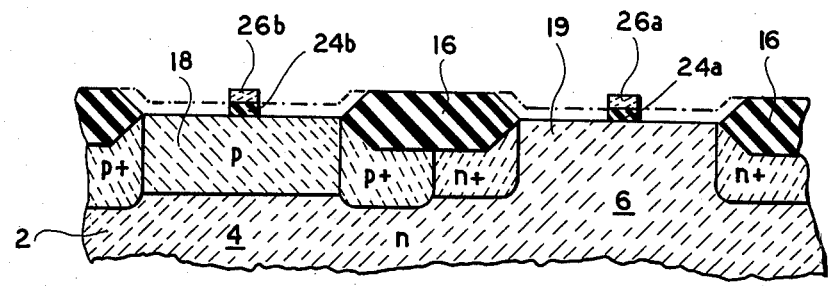
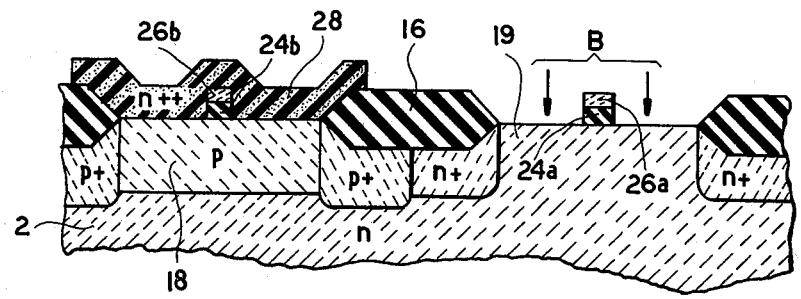
FIG. 5
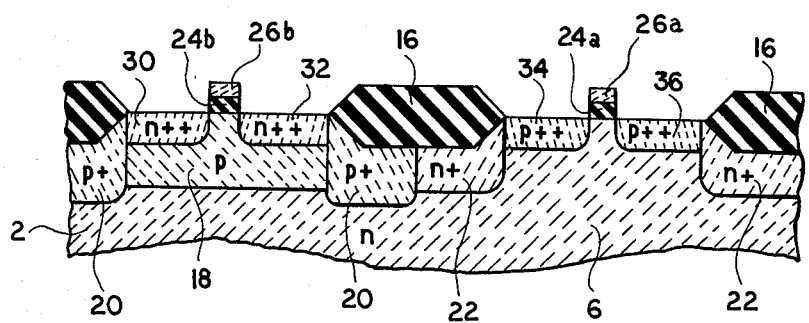
FIG. 6

PROCESS FOR MAKING CMOS FIELD-EFFECT TRANSISTORS

FIELD OF THE INVENTION

Our present invention relates to a process for making semiconductor structures including at least one pair of complementary MOS field-effect transistors generally known as CMOS FETs.

BACKGROUND OF THE INVENTION

CMOS FETs are useful as semiconductor switches operating at widely ranging supply voltages with low power consumption. According to conventional techniques, they are produced in a silicon substrate of one conductivity type (e.g. n) a region of which is subjected to implantation of impurities of the opposite conductivity type (p) to form a so-called well serving as the site of one of the two complementary FETs, specifically of the n-channel FET in the case of a p-well. An adjoining region of the original conductivity type then becomes the site of the other FET.

It is, of course, desirable that the two FETs be spaced as closely as possible from one another and from other components of the same silicon wafer. In order to avoid undesirable interaction between such closely spaced components, which could appear with operations at a relatively high voltage, it is known to separate them from one another by barriers which may be in the shape of surrounding guard rings and which in the case of field-effect transistors are referred to as channel stops. These channel stops are generally of the same conductivity type as the adjoining substrate region carrying the protected FET, but with a higher impurity concentration.

According to a method described in PRINCIPES ET APPLICATIONS DES CI/MOS, by H. Lilen, published 1972 by Editions Radio in Paris, France, pages 54–59, channel stops of p+ conductivity for an n-channel MOSFET are formed in a p-well of an n-type silicon substrate simultaneously with source and drain zones of a p-channel MOSFET in an adjoining region whereupon channel stops of n+ conductivity are formed in that adjoining region simultaneously with source and drain zones in the p-well; see particularly FIGS. 3–12 on page 57. The unavoidable physical separation of the n+ and p+ channel stops produced by this technique limits the number of semiconductor components that can be accommodated on a silicon wafer of given dimensions. To achieve a higher component density, U.S. Pat. No. 4,013,484 describes a process in which these channel stops of opposite conductivity type can be made contiguous. According to the latter process, two patches of silicon nitride topped by silicon oxide are deposited on a layer of silicon oxide overlying the n-type substrate above spaced-apart regions destined to become an n-channel FET and a p-channel FET, respectively. A heavy layer of field oxide is then produced in areas not covered by the two patches and is thereafter partly removed in a zone immediately adjoining the first patch to facilitate the implantation of p-type impurities (boron) into that zone, this being followed by a drive-in cycle in which the substrate is heated to promote the diffusion of the implanted boron into the region underlying that first patch to form a p-well. Thereafter, additional boron impurities are implanted at a reduced energy level to intensify the impurity concentration in the marginal zone of the p-well, thereby forming the channel stop associated with the n-channel FET. The formation of the other channel stop by the implantation of n-type impurities (arsenic) in a zone immediately adjoining the second patch, overlain by a remaining portion of the partly removed field oxide, is carried out upon removal of that remaining layer portion but could also have been performed at an earlier stage, before the thickening of the oxide layer; in that instance, as likewise noted in the patent, an arsenic-doped substrate portion adjoining the first patch would have to be removed before implantation of the boron particles or else the concentration and the penetration depth of these particles would have to be increased to compensate for the presence of the added n-type impurities. In any event, the prior process requires the buildup of another heavy oxide layer in the previously stripped zones of the substrate in which the two channel stops are formed, thereby creating an insulating barrier between the two complementary MOSFETs. It is only after this second oxidation step that the patches overlying the two MOSFET regions are removed to expose their respective source and drain sections for doping with impurities of the proper conductivity types.

The formation of an oxide layer of considerable thickness (on the order of 10,000 Å), occurring at the expense of an underlying silicon substrate, is a lengthy procedure requiring the maintenance of that substrate at a high temperature for a period of roughly 12 hours. Such a protracted heat treatment may have detrimental effects upon the substrate which are cumulative if the operation is repeated.

OBJECTS OF THE INVENTION

The general object of our present invention, therefore, is to provide an improved process for the production of CMOS FETs with contiguous channel stops in which only one heavy oxide layer needs to be formed.

Another object is to facilitate, in such a process, the concurrent doping of source and drain sections in an exposed region of the unaltered substrate and in a well of the opposite conductivity type formed therein.

SUMMARY OF THE INVENTION

In accordance with our present invention, a first and a second patch of shielding material such as silicon nitride are formed, as known per se, on an oxide layer overlying a silicon substrate of one conductivity type, above spaced-apart first and second regions of that substrate, whereupon impurities of that one conductivity type are injected through the oxide layer into zones of the substrate immediately adjoining both regions, these zones including an intermediate section which separates the two regions from each other. Next, the first patch and an immediately adjoining first zone of the oxide layer—including a portion thereof overlying part of the intermediate section—are covered with a masking layer while the second patch and an immediately adjoining second zone of the oxide layer—including a portion thereof overlying another part of the intermediate section—are left uncovered. Impurities of the opposite conductivity type are then injected into the substrate through the second patch and through the second zone of the oxide layer in a quantity sufficient to overcompensate the effect of the impurities of the first-mentioned conductivity type which were previously injected into that second zone and to implant the impurities of the opposite conductivity type with a relatively high concentration in the second zone and with a lower concentration in the second region bounded thereby. Following removal of the masking layer, the substrate is subjected to a heat treatment whereby the oxide layer already present thereon is caused to grow, especially in the areas free from the patches. Thereafter the two patches are removed together with underlying portions of the oxide layer so as to expose both the first and the second region of the substrate except for a residue of the oxide layer which extends across each of these regions to serve as an insulating gate support while dividing each region into source and drain areas. Finally, impurities of the first-mentioned conductivity type are introduced into the source and drain areas of the second region while impurities of the opposite conductivity type are introduced into corresponding areas of the first region.

Pursuant to another feature of our invention, the introduction of impurities into the source and drain areas of the second region is performed by covering that region with a stratum of silicon oxide doped with such impurities (whose conductivity type is the same as that of the substrate), heating the substrate to transfer a significant amount of these impurities from the oxide stratum to the underlying substrate areas preferably concurrently with the doping of the exposed areas of the first region with impurities of the opposite conductivity type, and thereupon removing the doped oxide stratum.

BRIEF DESCRIPTION OF THE DRAWING

The above and other features of our present invention will now be described in detail with reference to the accompanying drawing in which:

FIGS. 2–6 are views similar to FIG. 1, showing successive steps of that process.

SPECIFIC DESCRIPTION

Figure 1:
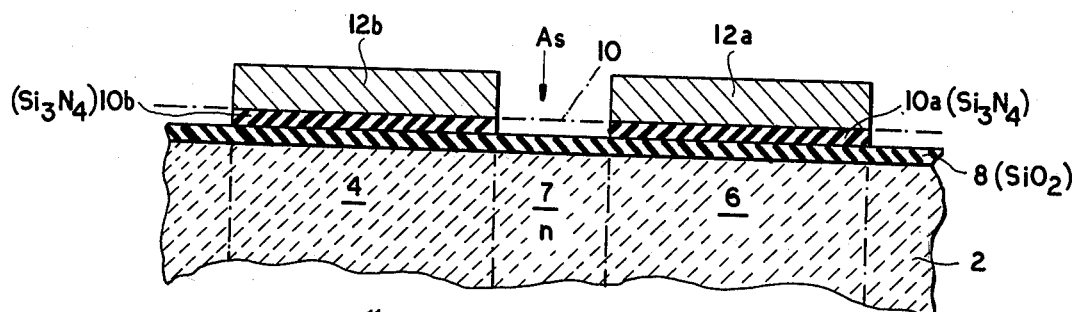
FIG. 1 is a cross-sectional view of a representative portion of a silicon wafer in an initial stage of our improved process.

In FIG. 1 we have shown a substrate 2 of essentially monocrystalline n-type silicon overlain by a thin layer 8 of silicon dioxide. The illustrated portion of substrate 2 forms part of a larger wafer in which one or more pairs of complementary MOSFETs are to be produced, possibly along with other kinds of semiconductor components. The substrate includes two regions 4 and 6 respectively allocated to an n-channel and a p-channel field-effect transistor; these regions are separated by an intermediate section 7 providing space for the associated channel stops.

Oxide layer 8 is covered above region 6 by a first patch 10a of shielding material $Si_3N_4$ topped by a mask 12a of photoresist; a second $Si_3N_4$ patch 10b with a photoresist mask 12b is located on the oxide layer above region 4. It will be understood that patches 10a and 10b are originally part of a layer 10 coextensive with oxide layer 8, overlying the entire wafer, and that the removal of part of this layer 10 above the intermediate section 7 and other portions of the substrate is carried out in the usual manner after selective destruction of the originally coextensive photoresist deposit by the usual photolithographic procedures. The $SiO_2$ layer 8 may have a thickness of about 300 Å while that of the $Si_3N_4$ layer 10 may be approximately 1,000 Å.

The wafer is then subjected to a bombardment by arsenic ions which penetrate the uncovered portions of the oxide layer 8 and increase the concentration of n-type impurities in the underlying substrate zones. If the patches 10a, 10b are strips extending parallel to each other across the wafer, these uncovered portions and the resulting zones of n+ conductivity will also be parallel strips; otherwise, they may form rings around the patches and the underlying regions 4 and 6, separating them from each other and from further components in both the longitudinal and the transverse dimensions of the wafer. The As ions used for this implantation step may be injected with an energy level of 50 KeV and in a sufficient quantity to provide a doping level of about $5 \cdot 10^{11}/cm^2$ in the zones immediately below the oxide layer. The surface portion of substrate 2 initially permeated by these n+ impurities is relatively shallow and has been indicated at 13 in FIG. 2.

Figure 2:
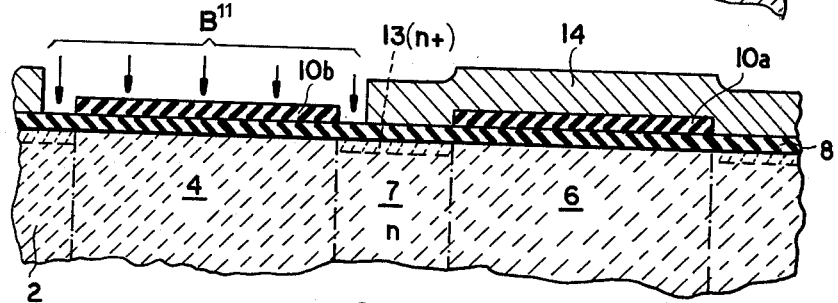

The photoresist masks 12a and 12b (together with their counterparts elsewhere on the wafer) are then removed whereupon another such mask 14, shown in FIG. 2, is formed above the patch 10a and adjoining portions of layer 8, overhanging a major part but not all of the intermediate section 7. This leaves uncovered the patch 10b and immediately adjoining oxide portions, one of then extending above a minor part of intermediate section 7. Next, the wafer is bombarded by ions of boron $B^{11}$ of such energy and in such quantity as to pass not only through the uncovered zones of the oxide layer but also through the patch 10b to reverse the conductivity type of the underlying substrate portions, including those in which arsenic ions were previously implanted. This leads to the formation of a p-well 18 (FIG. 3) surrounded or otherwise bounded by a zone or zones 20 of p+ conductivity constituting a channel stop for the n-channel MOSFET to be produced. With accurate dosing of the bombarding boron ions and maintenance of the thicknesses of layers 8 and 10b within narrow tolerances, such an impurity distribution could be achieved in a single implantation step. We prefer, however, to inject these p-type impurities in two stages, one of them with an energy level (e.g. of 30 KeV) insufficient to penetrate the patch 10b so that only the adjoining uncovered zones of oxide layer 8 are traversed by the ions to overbalance the previously implanted n-type impurities, the other stage using an energy level (e.g. of 100 KeV) enabling penetration of both the $Si_3N_4$ patch 10b and the underlying oxide. The concentration of p-type impurities in the guard zone 20 resulting from the low-energy bombardment may be about $10^{12}/cm^2$.

Figure 3:
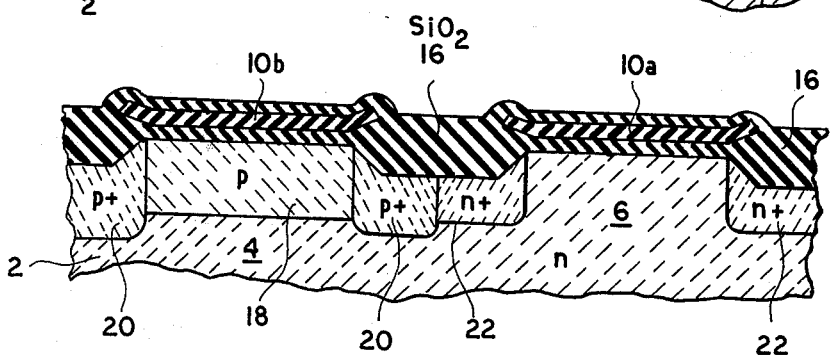

The p-type impurities thus implanted in substrate region 4 and its immediate vicinity do not initially occupy the substrate portions 18 and 20 shown in FIG. 3 but diffuse into them only gradually, particularly during a subsequent heat treatment to which the wafer is subjected after removal of the mask 14. That treatment step, in which the wafer is maintained at a temperature of about 900° C., also serves as a drive-in operation in which not only the boron ions in and around region 4 but also the arsenic ions around region 6 penetrate further into the substrate, the latter ions thus forming a guard zone 22 constituting a channel stop for the p-channel MOSFET to be produced. The heat treatment in an oxidizing atmosphere results in a growth of the layer 8, predominantly in areas free from patches 10a and 10b, to a thickness of about 10,000 Å whereby heavy barriers 16 are formed above guard zones 20 and 22. The barriers 16 remain essentially intact upon the subsequent removal of the remainder of the oxide layer, along with patches 10a and 10b, except for a pair of strips 24b, 24a respectively bisecting the well 18 in region 4 and an exposed pedestal 19 forming part of region 6, see FIG. 4; these oxide strips 24a and 24b are covered, in conventional manner, by respective deposits 26a and 26b of polycrystalline silicon to form insulated gates for the two complementary MOSFETs.

As illustrated in FIG. 5, well 18 together with gate 26b and its insulating support 24b is then covered by a stratum 28 of silicon dioxide heavily doped with n+ impurities, e.g. phosphorus ions. It will be understood that such a stratum can be produced by vapor deposition and will then overlie the entire wafer from which it is to be partially removed to leave only the portion shown in FIG. 5. When the wafer is then subjected to an elevated temperature in a boron atmosphere, phosphorus ions are transferred from stratum 28 to source and drain areas of p-well 18 on opposite sides of oxide strip 24b while at the same time there occurs a diffusion of boron ions into corresponding areas of pedestal 19 separated by oxide strip 24a. It will be apparent that the phosphorus-doped oxide stratum 28 shields the p-well 18 from the boron ions during this operation. Thus, as shown in FIG. 6, there are obtained islands 30 and 32 of n++ conductivity type, representing the source and the drain of an n-channel MOSFET, along with islands 34 and 36 of p++ conductivity type, representing the source and the drain of a p-channel MOSFET. These MOSFETs are subsequently completed, in a conventional manner not further illustrated, by the deposition of metallic electrodes on their active elements, i.e. on the source and drain areas as well as on the insulated gates 26a, 26b.

Naturally, our improved process can also be used with inverted polarities, i.e. with formation of an n-well in a p-type substrate and diffusion of p-type impurities from a doped oxide stratum into exposed areas of that well while corresponding areas on a pedestal of the unmodified substrate are subjected to n-type doping.

We claim:

1. A process for making complementary MOS field-effect transistors with contiguous channel stops in a silicon substrate of one conductivity type overlain by an oxide layer, comprising the steps of:
   (a) forming a first and second patch of shielding material on said oxide layer above spaced-apart first and second regions of said substrate;
   (b) injecting impurities of said one conductivity type through said oxide layer into zones of said substrate immediately adjoining said first and second regions, including an intermediate section separating said first and second regions;
   (c) covering said first patch and at least one immediately adjoining first zone of said oxide layer, including a portion thereof overlying part of said intermediate section, with a masking layer while leaving uncovered said second patch and at least one immediately adjoining second zone of said oxide layer, including a portion thereof overlying another part of said intermediate section;
   (d) injecting impurities of the opposite conductivity type into said substrate through said second patch and through said second zone in a quantity sufficient to overcompensate the effect of the impurities of said one conductivity type injected into said second zone in step (b) and to implant said impurities of the opposite conductivity type with a relatively high concentration in said uncovered second zone and with a lower concentration in said second region shielded by said second patch;
   (e) removing said masking layer;
   (f) subjecting said substrate to a heat treatment with growth of said oxide layer predominantly in areas free from said patches;
   (g) removing said patches together with underlying portions of said oxide layer, thereby exposing said first and second regions except for a residue of said oxide layer extending across each of said regions and dividing same into source and drain areas while forming an insulating gate support; and
   (h) introducing impurities of said one conductivity type and of said opposite conductivity type into the source and drain areas of said second and said first region, respectively.

2. A process as defined in claim 1 wherein the injection of impurities of the opposite conductivity type in step (d) is carried out in two stages, one of said stages involving a bombardment with ions of relatively low intensity unable to penetrate said second patch while traversing said second zone of said oxide layer, the other of said stages involving a bombardment with ions of relatively high intensity penetrating both said oxide layer and said second patch.

3. A process as defined in claim 1 or 2 wherein said shielding material is silicon nitride.

4. A process as defined in claim 1 or 2 wherein the introduction of impurities into the source and drain areas of said second region in step (h) is performed by covering said second region with a stratum of silicon oxide doped with impurities of said one conductivity type, heating said substrate to transfer impurities from said stratum to the underlying substrate areas concurrently with a doping of the exposed areas of said first region with impurities of said opposite conductivity type, and then removing said stratum.

* * * * *